US007910982B2

(12) United States Patent
Oyu

(10) Patent No.: US 7,910,982 B2
(45) Date of Patent: Mar. 22, 2011

(54) SEMICONDUCTOR APPARATUS AND PRODUCTION METHOD OF THE SAME

(75) Inventor: Kiyonori Oyu, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 351 days.

(21) Appl. No.: 12/132,977

(22) Filed: Jun. 4, 2008

(65) Prior Publication Data

US 2008/0303083 A1    Dec. 11, 2008

(30) Foreign Application Priority Data

Jun. 6, 2007    (JP) ................................. 2007-150284

(51) Int. Cl.
*H01L 29/66* (2006.01)
(52) U.S. Cl. ................................. 257/328; 257/E27.046
(58) Field of Classification Search .................. 257/328, 257/329, 331, E27.046
See application file for complete search history.

(56) References Cited

U.S. PATENT DOCUMENTS

| 6,150,687 A | 11/2000 | Noble et al. | |
|---|---|---|---|
| 7,098,478 B2 * | 8/2006 | Takaura et al. | 257/67 |
| 2006/0081884 A1 * | 4/2006 | Abbott et al. | 257/208 |

FOREIGN PATENT DOCUMENTS

| JP | 04176168 | 6/1992 |
|---|---|---|
| JP | 05136374 | 6/1993 |
| JP | 05160408 | 6/1993 |

* cited by examiner

*Primary Examiner* — Evan Pert
*Assistant Examiner* — Eduardo A Rodela
(74) *Attorney, Agent, or Firm* — Sughrue Mion, PLLC

(57) ABSTRACT

In order to provide a highly integrated semiconductor apparatus and a production method thereof which can avoid the floating of a channel portion that causes a problem when constituting a memory cell from three-dimensional transistors, a semiconductor apparatus includes: multiple three-dimensional transistors each of which includes: a first pillar; a channel portion provided at the first pillar; diffused layers formed at both an upper portion and a lower portion of the channel portion; and a gate electrode provided around the channel portion via a gate insulation film; and a second pillar which is electrically conductive, wherein the multiple three-dimensional transistors are arranged on a well area while surrounding the second pillar, the multiple three dimensional transistors share the second pillar, and the channel portions of the multiple three dimensional transistors are each connected to the second pillar by a channel connection portion. In addition, six three-dimensional transistors preferably share the second pillar which is a single pillar.

11 Claims, 13 Drawing Sheets

FIG. 3A
FIG. 3B
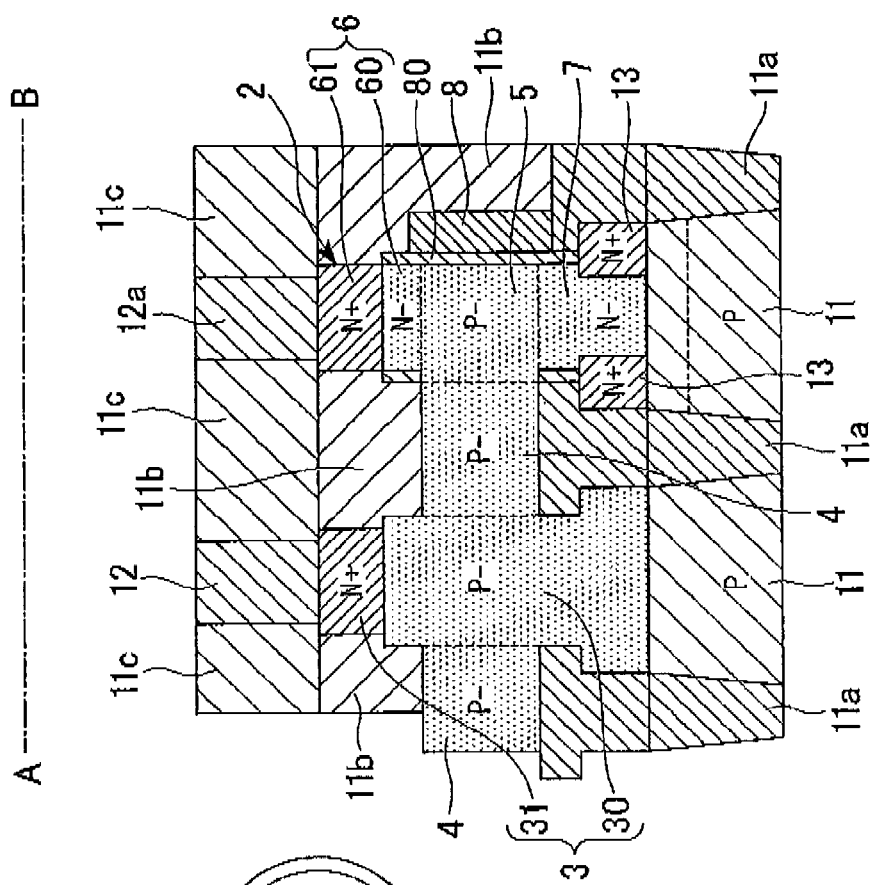
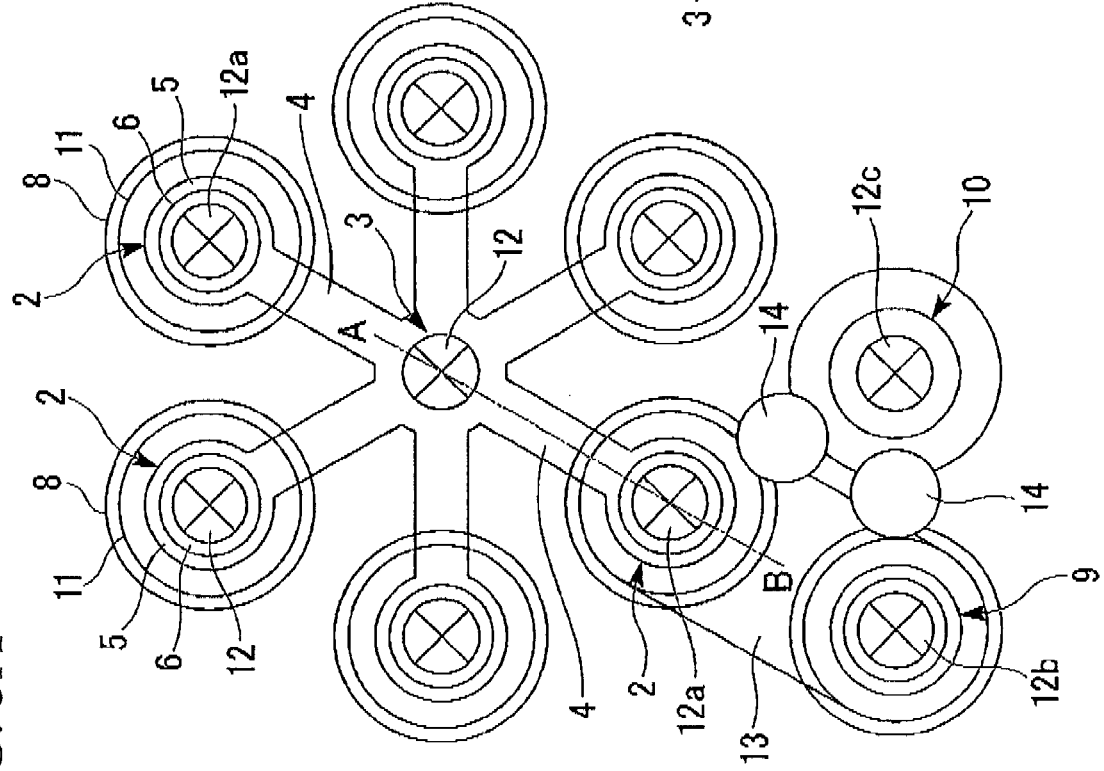

SEMICONDUCTOR APPARATUS AND PRODUCTION METHOD OF THE SAME

BACKGROUND OF THE INVENTION

1. Field of the Invention

The present invention relates to a semiconductor apparatus which includes a three-dimensional transistor and a production method thereof.

Priority is claimed on Japanese Patent Application No. 2007-150284, filed Jun. 6, 2007, the content of which is incorporated herein by reference.

2. Description of the Related Art

Because of requirements for a high integration in the semiconductor field, elements of the semiconductor apparatus have been being small and fine. Due to such requirements, a three-dimensional transistor has been developed in which elements are vertically arranged in order to integrate more elements in a smaller area compared to that of a conventional planer transistor.

There is a generally-known constitution of such a three-dimensional transistor called SGT (surrounding gate transistor).

In a constitution of SGT, for example, as shown in FIG. 13, a silicon pin 101 which constitutes a three-dimensional transistor is set on a substrate 100. The silicon pin 101 includes both a channel portion 102 and source/drain diffused layers 103 (upper diffused layer (drain diffused layer) 103a and lower diffused layer (source diffused layer) 103b) which are formed at an upper portion and lower portion of the silicon pin 101. The channel portion (a portion of p type Si) 102 provided at a center portion of the silicon pin 101 has a constitution in which the channel portion 102 is surrounded by both a gate insulation film 104 and a gate electrode 105. A source electrode 106 is provided under the lower diffused layer (source diffused layer) 103b which is provided under the channel portion 102. A drain electrode 107 is provided on the upper diffused layer (drain diffused layer) 103b which is provided above the channel portion 102. In other words, in the constitution of the silicon pin 101, the source/drain diffused layers 103 are provided on and under the channel portion 102.

Patent Document 1 discloses both a three-dimensional transistor which is obtained by controlling a depletion layer extending in a direction from the outside to the inside of the channel portion 102 and a DRAM (Dynamic Random Access Memory) including the three-dimensional transistor.

Patent Document 2 discloses a MIS (Metal Insulator Semiconductor) DRAM.

Patent Documents 3 and 4 disclose a semiconductor apparatus which includes a constitution of a memory cell by using such a three dimensional transistor.

FIG. 14 shows one example of a constitution of a memory cell including a conventional three-dimensional transistor. Regarding this three-dimensional transistor, on a silicon substrate 200, multiple three-dimensional transistors 210 are arranged at even intervals on multiple bit lines 205 which are arranged in parallel in a vertical direction in FIG. 14. A pair of gate electrodes (word lines) 206a and 206b are arranged between the multiple three-dimensional transistors 201 and are arranged in a horizontal direction in FIG. 14 while crossing the bit lines 205.

Each of the multiple three-dimensional transistors 201 has a constitution in which the lower diffused layer 203b, the channel portion 202 and the upper diffused layer 203a are provided on the bit lines 205, and a capacitor 204 is provided on the upper diffused layer 203, and consequently, a memory cell is constituted.

[Patent Document 1] Japanese Patent Application, First Publication No. H5-160408
[Patent Document 2] Japanese Patent No. 2941039
[Patent Document 3] U.S. Pat. No. 6,150,687
[Patent Document 4] Japanese Patent Application, First Publication No. H05-136374

However, compared to a conventional planer transistor in which the electric potential or voltage of a channel portion is controlled by a substrate, in a constitution of a three-dimensional transistor shown in FIG. 14, even though the electric potential of the upper and lower diffused layers are controlled, the potential of a channel portion which is arranged between them is not controlled and is a floating area. Therefore, there is a problem in which the threshold voltage of the transistor is fluctuated (floating body effect) because of a positive electric charge at the channel portion caused by using the transistor. In order to avoid such a problem, regarding the memory cell shown in FIG. 14, a constitution is proposed in that one of the gate electrodes 206a and 206b is connected to the channel portion 202. However, in such a proposal, it is difficult to achieve high integration.

SUMMARY OF THE INVENTION

The present invention was conceived in order to solve the above-described problem, and has an object to provide a highly integrated semiconductor apparatus and a production method thereof which can avoid the floating of a channel portion that causes a problem when constituting a memory cell from three-dimensional transistors.

In order to solve the above-described problem, the present invention provides, for example, following aspects.

A first aspect is a semiconductor apparatus including: multiple three-dimensional transistors each of which comprises: a first pillar; a channel portion provided at the first pillar; diffused layers formed at both an upper portion and a lower portion of the channel portion; and a gate electrode provided around the channel portion via a gate insulation film; and a second pillar which is electrically conductive, wherein the multiple three-dimensional transistors are arranged on a well area while surrounding the second pillar, the multiple three dimensional transistors share the second pillar, and the channel portions of the multiple three dimensional transistors are respectively connected to the second pillar by a channel connection portion.

A second aspect is the above-described semiconductor apparatus, wherein six of the three-dimensional transistors share the second pillar which is a single pillar and are connected to the second pillar while surrounding the second pillar.

A third aspect is the above-described semiconductor apparatus, wherein each of the three-dimensional transistors includes both a lower diffused layer leading portion and a gate electrode leading portion that are close to the first pillar, and the three-dimensional transistors surrounded by the well layer constitute a module in which each of the three-dimensional transistors is arranged at a vertex of a hexagon that has a center at which the second pillar is set.

A fourth aspect is the above-described semiconductor apparatus, wherein the module is arranged in a honeycomb state.

A fourth aspect is a semiconductor apparatus production method including the steps of: forming a channel portion around each of multiple first pillars; forming diffused layers at an upper portion and a lower portion of the channel portion; forming each of multiple three-dimensional transistors by forming a gate terminal around the channel portion via a gate insulation film; and arranging the multiple three-dimensional transistors on a well area while surrounding a second pillar which is electrically conductive, wherein the multiple three-dimensional transistors share the second pillar which is a single pillar, and the channel portions of the multiple three dimensional transistors are respectively connected to the second pillar by a channel connection portion.

A fourth aspect is the above-described semiconductor apparatus production method, wherein six sets of the three-dimensional transistors share the second pillar and are connected to the second pillar while surrounding the second pillar.

A seventh aspect is the above-described semiconductor apparatus production method, wherein each of the three-dimensional transistors includes both a lower diffused layer leading portion and a gate electrode leading portion that are formed to be close to the first pillar, and each of the three-dimensional transistors is arranged as a module surrounded by the well layer and is arranged at a vortex of a hexagon that has a center at which the second pillar is set.

An eighth aspect is the above-described semiconductor apparatus production method, wherein the module is arranged in a honeycomb state.

A ninth aspect is a semiconductor apparatus including a transistor which includes: a first diffused layer; a second diffused layer; a channel portion provided between the first and second diffused layers; a gate insulation film covering a surface of the channel portion; a first pillar in a cylindrical shape formed in a vertical direction on a substrate; and a second pillar in a cylindrical shape formed in a vertical direction on the substrate, wherein the channel portion of the first pillar is electrically connected to the second pillar.

A tenth aspect is the above-described semiconductor apparatus, wherein the first pillar is multiple, the multiple first pins are arranged around the second pillar, and each of the channel portions of the multiple first pillars is electrically connected to the second pillar.

An eleventh aspect is the above-described semiconductor apparatus, wherein the first pillar and the multiple second pillars constitute one set of pins, and the semiconductor apparatus includes multiple sets of pins.

The semiconductor apparatus of the above-described aspect includes multiple three-dimensional transistors which are arranged on a well area so as to surround an electrically-conductive second pillar and which each have: a first pillar; a channel portion provided at the first pillar; diffused layers formed at both an upper portion and a lower portion of the channel portion; and a gate electrode provided around the channel portion via a gate insulation film. In addition, the multiple three dimensional transistors share the second pillar which is a single pillar, and the channel portions of the multiple three dimensional transistors are each connected to the second pillar. Therefore, the electric potential of the channel portion is fixed by the second pillar, and it is possible to reduce the floating body effect.

In addition, in the semiconductor apparatus of the above-described aspect, the above-described three-dimensional transistors that are six transistors share the second pillar which is a single pillar and are connected to the second pillar while surrounding the second pillar. Therefore, the three-dimensional transistors are arranged in a closest packed structure, and it is possible to obtain a semiconductor apparatus that is highly integrated.

In addition, in the semiconductor apparatus of the above-described aspect, each of the three-dimensional transistors has both a lower diffused layer leading portion and a gate electrode leading portion that are close to the first pillar. The three-dimensional transistors surrounded by the well layer constitute a module in a manner in which each of the three-dimensional transistors is arranged at a vertex of a hexagon that has a center at which the second pillar is set. Therefore, by using such a module as a unit, it is possible to constitute a transistor from multiple units, and it is possible to produce a semiconductor apparatus which is large and has a complicated structure.

In addition, in the semiconductor apparatus of the above-described aspect, the modules are arranged in a honeycomb state. Therefore, it is possible to achieve a closest packed structure, it is possible to achieve a fine layout, and it is possible to produce a further highly integrated semiconductor apparatus.

In addition, in the semiconductor apparatus production method of the above-described aspect, semiconductor apparatus includes steps of: forming a channel portion around each of multiple first pillars; forming diffused layers at an upper portion and a lower portion of the channel portion; forming each of multiple three-dimensional transistors by forming a gate terminal around the channel portion via a gate insulation film; and arranging the multiple three-dimensional transistors on a well area while surrounding a second pillar which is electrically conductive. In addition, the multiple three-dimensional transistors share the second pillar which is a single pillar, and the channel portions of the multiple three dimensional transistors are respectively connected to the second pillar by the channel connection portion. Therefore, the electric potential of the channel portion is fixed by the second pillar, and it is possible to reduce the floating body effect.

In addition, in the semiconductor apparatus production method of the above-described aspect, the above-described three-dimensional transistors in this case, six transistors share the second pillar which is a single pillar and are connected to the second pillar while surrounding the second pillar. Therefore, the three-dimensional transistors are arranged in a closest packed structure, and it is possible to obtain a semiconductor apparatus that is highly integrated.

In addition, in the semiconductor apparatus production method of the above-described aspect, each of the three-dimensional transistors is formed so as to have both a lower diffused layer leading portion and a gate electrode leading portion that are close to the first pillar. The three-dimensional transistors surrounded by the well layer constitute a module in a manner in which each of the three-dimensional transistors is arranged at a vertex of a hexagon that has a center at which the second pillar is set. Therefore, by using such a module as a unit, it is possible to constitute a transistor from multiple units, and it is possible to produce a semiconductor apparatus which is large and has a complicated structure.

In addition, in the semiconductor apparatus production method of the above-described aspect, the modules are arranged in a honeycomb state. Therefore, it is possible to achieve a closest packed structure, it is possible to achieve a fine layout, and it is possible to produce a her highly integrated semiconductor apparatus.

BRIEF DESCRIPTION OF THE DRAWINGS

FIG. 3A is a plane view of a three-dimensional transistor of the embodiment.

FIG. 3B shows a cross-section of a three-dimensional transistor of the embodiment taken along a line A-B of FIG. 3A.

DETAILED DESCRIPTION OF THE INVENTION

Hereinafter, an embodiment which is an example of the present invention is explained in reference to the drawings.

Figure 1:
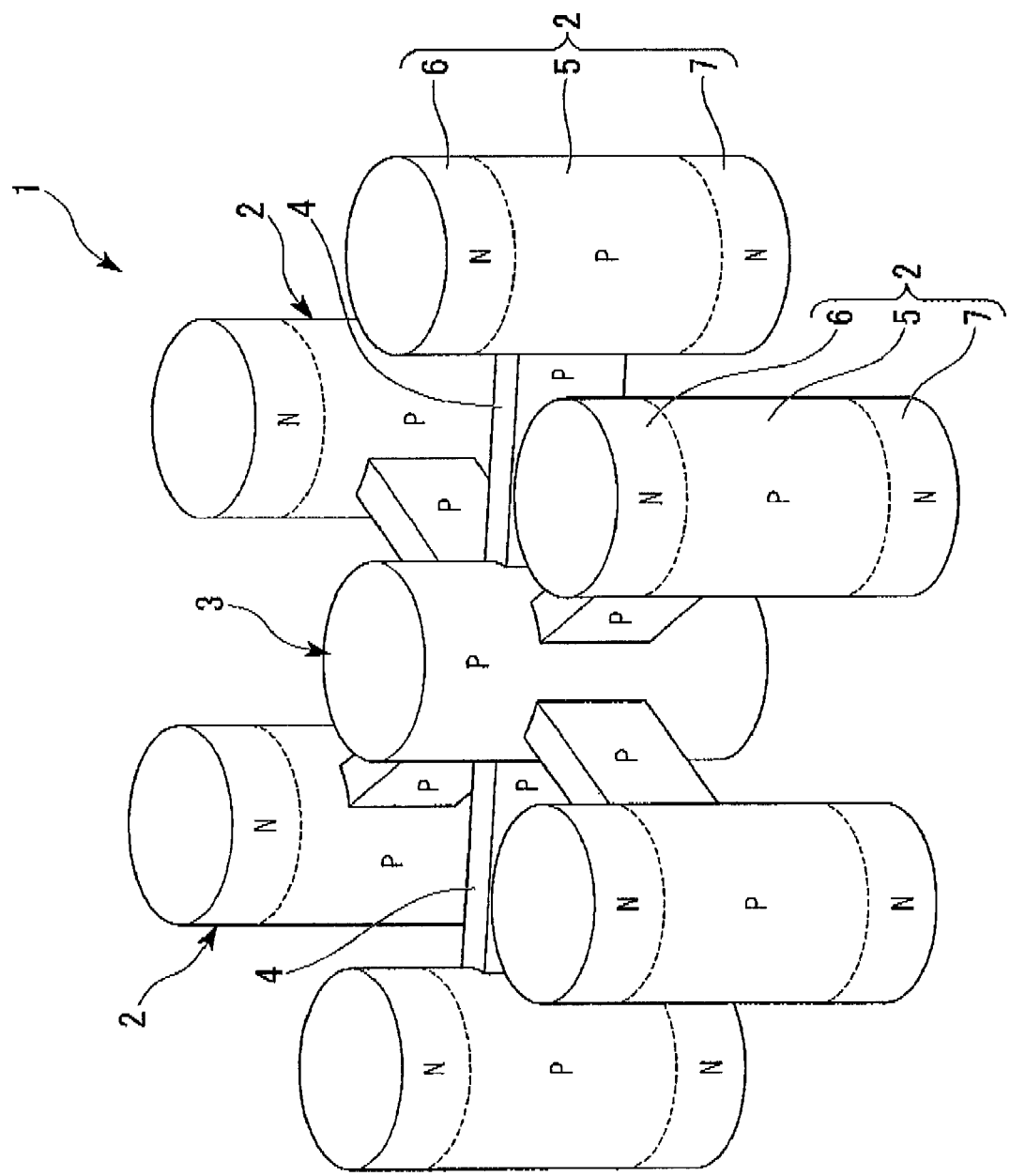
FIG. 1 shows a perspective view of a fundamental constitutional portion of a three-dimensional transistor of one embodiment.

FIG. 1 shows a fundamental constitutional portion (silicon portion) of a three-dimensional transistor 1 which is an N-channel MOS (N-MOS) transistor. The fundamental constitutional portion is constituted from 7 pillars including one pillar which is at the center of the fundamental constitutional portion and which is surrounded by 6 other pins that are arranged so as to have equally-spaced intervals between each other. Six sets of the first pillars 2, not including the center portion of the fundamental constitutional portion, constitute six transistors. The second pillar 3 is arranged at the center portion of the fundamental constitutional portion and is connected to side walls of the channel portions 5 of six sets of the first pillars 2 via channel connection portions 4 which are P type.

The first pillar 2 has a center portion constituted from the channel portion 5 which is a P type Si and has both an upper diffused layer 6 which is N– type Si on the channel portion 5 and a lower diffused layer 7 which is N– type Si under the channel portion 5. The upper diffused layer 6 has an upper portion and a lower portion, the lower portion is constituted from an N– layer 60, and the upper portion is constituted from an N+ layer 61 (for example, see FIG. 3B). The channel portion 5 works as a resource which supplies electric potential or voltage to a P type well area, and both the upper portion diffused layer 6 and the lower portion diffused layer 7 work as a source and a drain of the N-MOS transistor (three-dimensional transistor 1).

Figure 2:
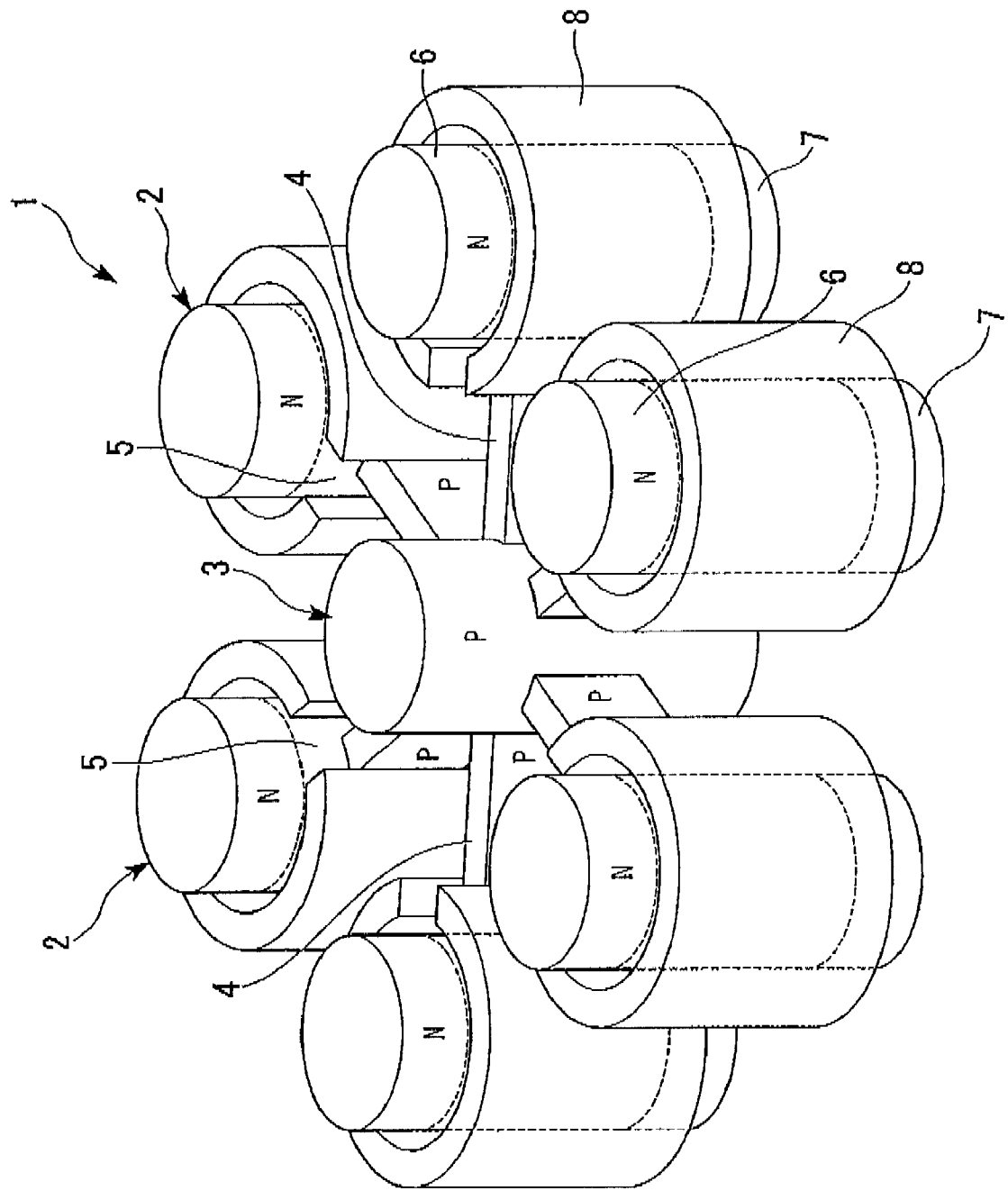
FIG. 2 shows a perspective view of a truce-dimensional transistor of the embodiment.

In addition, as shown in FIG. 2, the three-dimensional transistor 1 has a fundamental constitution a gate terminal 8 is arranged so as to surround each of the channel portions 5 via a gate insulation film 80 (see FIG. 3B, the gate insulation film 80 is not shown in FIG. 2).

As shown in FIG. 3A, both a lower portion diffused layer leading portion 9 in a cylindrical shape and a gate electrode leading portion 10 in a cylindrical shape are provided outside one of the first pillars 2, and these three portions constitute a fundamental portion of a transistor. (It should be noted that in FIG. 3B, "N+" indicates a high concentration area of N– type, and "N–" indicates a low concentration area of N– type. In addition, in FIG. 3B, "P+" indicates a high concentration area of P type, and "P–" indicates a low concentration area of P type.)

The first pillar 2, the second pillar 3, the lower portion diffused layer leading portion 9 and the gate electrode leading portion 10 are formed on the P type well area (well area) 11. An upper portion diffused layer contact 12a is formed at an upper portion of the first pillar 2. A well contact 12 is formed at an upper portion of the second pillar 3. A lower portion diffused layer contact 12b is formed at an upper portion of the lower portion diffused layer leading portion 9. A gate contact 12c is formed on an upper portion of the gate electrode leading portion 10.

Both a middle portion and a lower portion of the second pillar 3 are constituted from a P– layer 30, and an upper portion of the second pillar 3 is constituted from a P+ layer 31. Therefore, it is possible to fix or set the electric potential of the P type well layer 11 in accordance with the electric potential of the well contact 12.

In other words, by setting or fixing the electric potential of the P type well area 11 which is provided at a lower portion of the first pillar 2, it is possible to set or fix an electric potential of the channel portion 5 via the lower portion diffused layer 7, and consequently, it is possible to obtain an advantage of reducing floating body effects.

It should be noted that around the P type well area (well area) 11 and under a channel connection portion 4 of a fundamental portion of the transistor, a first insulation layer 11a is formed. Above the first insulation layer 11a, a second insulation layer 11b is formed as high as the upper portion diffused layer 6 so as to surround a fundamental portion of the transistor. On the second insulation layer 11b, a third insulation layer 11c is formed as high as the upper portion diffused layer contact 12a, the well contact 12 and the lower portion diffused layer contact 12b while surrounding these contacting portions.

Figure 4A:
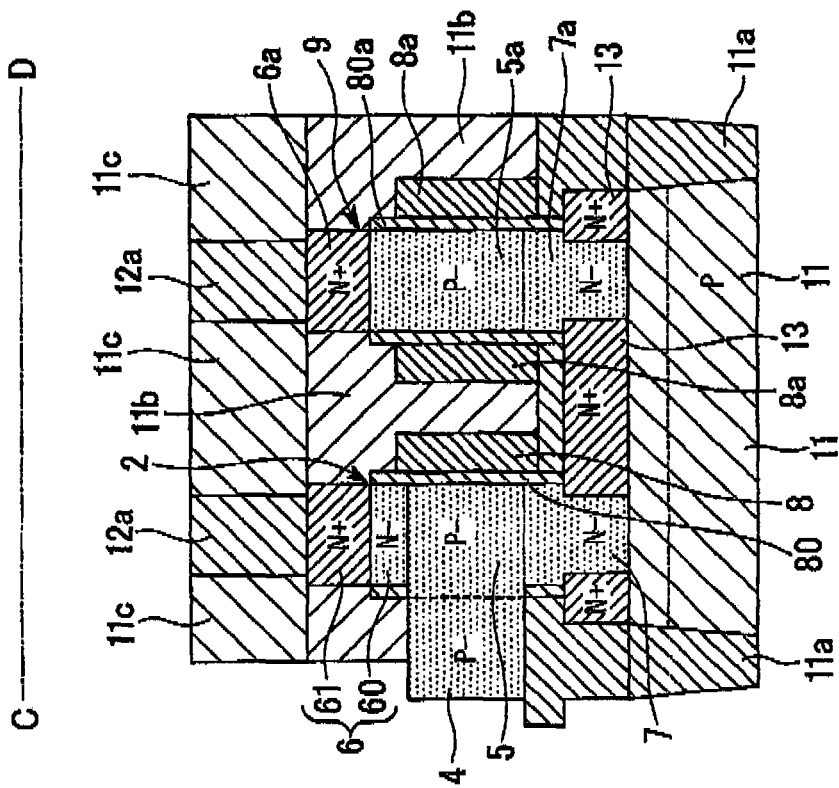
FIG. 4A is a plane view of a three-dimensional transistor of the embodiment.
Figure 4B:
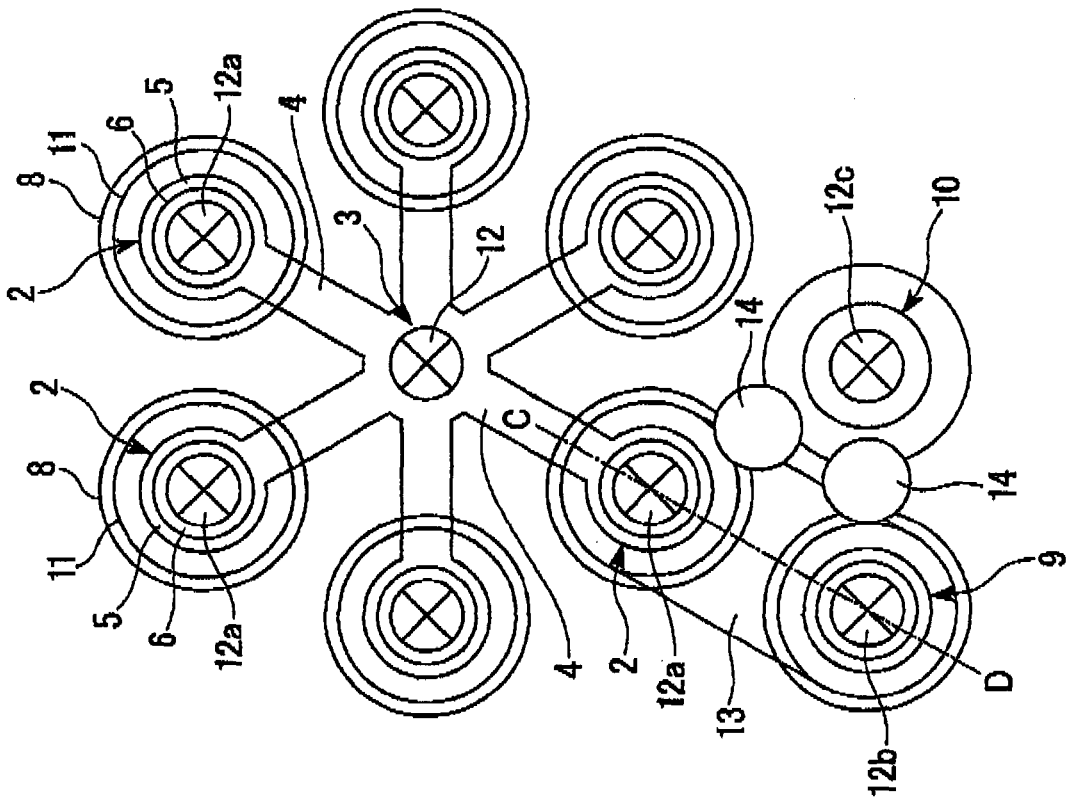
FIG. 4B shows a cross-section of a three-dimensional transistor of the embodiment taken along a line C-D of FIG. 4A.

As shown in FIG. 4B, the lower portion diffused layer leading portion 9 provides a channel portion 5a which has a center portion of P– type in a similar manner as the first pillar 2, and the channel portion 5a is surrounded by the gate electrode 8a via the gate insulation film 80a.

An upper portion diffused layer 6a which is of N+ type is provided at an upper portion of the channel portion 5a, and a lower portion diffused layer 7a which is of N– type is provided at a lower portion of the channel portion 5a. A bottom portion diffused layer 13 which is of N type and is provided under the lower portion diffused layer 7a is shared by the lower portion diffused layer 7a and the lower portion diffused layer 7 of the first pillar 2.

In other words, the lower portion diffused layer leading portion 9 is constituted in the same manner as the conventional transistor. When the electric potential of a transistor is turned on by the gate electrode 8a, the channel portion 5a is turned and continuity is obtained between the upper portion diffused layer 6a and the lower portion diffused layer 7a. Therefore, it is possible to control the electric potential of the lower portion diffused layer 7 of the first pillar 2 in accordance with the electric potential of the lower portion diffused layer contact 12b.

Figure 5A:
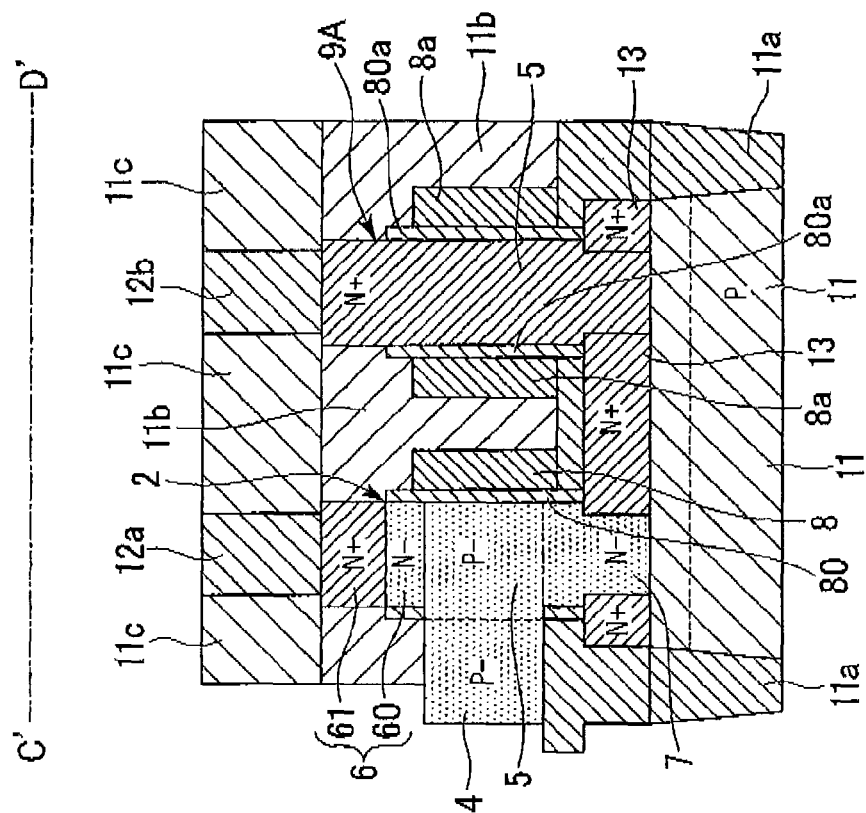
FIG. 5A is a plane view of a three-dimensional transistor of the embodiment.
Figure 5B:
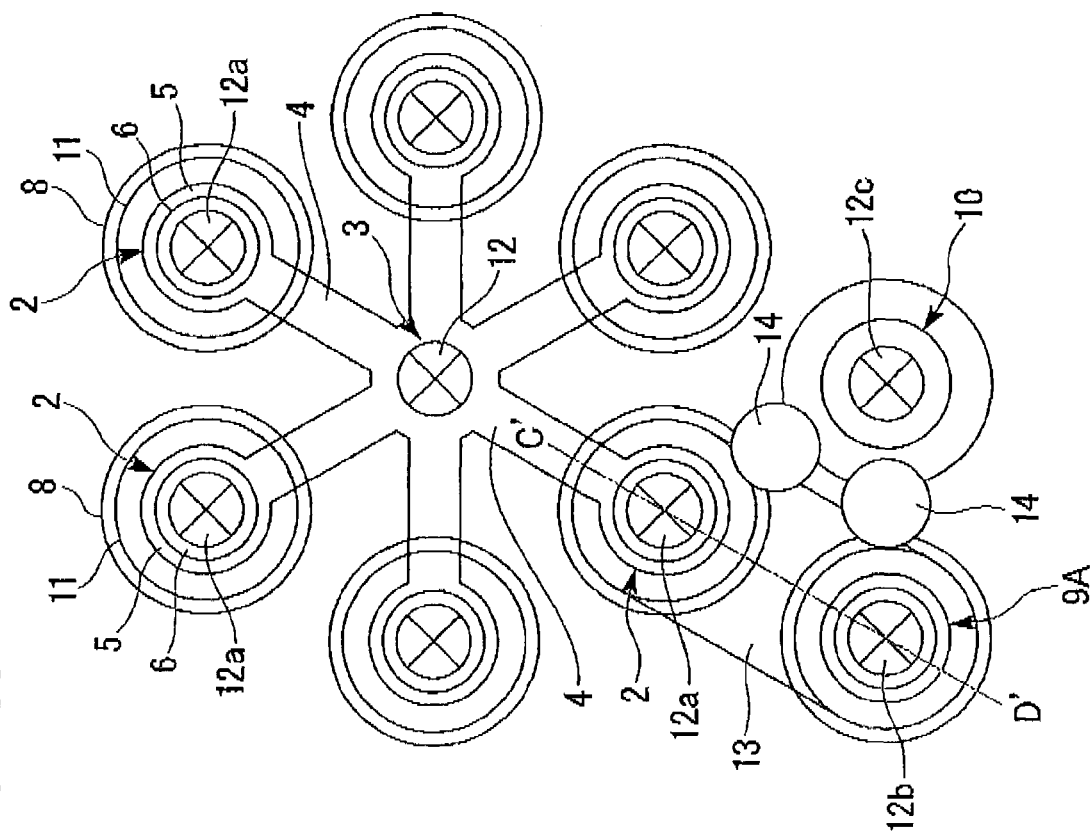
FIG. 5B shows a cross-section of a three-dimensional transistor of the embodiment taken along a line C'-D' of FIG. 5A.

In addition, as shown in FIG. 5B, overall portions of the lower portion diffused layer leading portion 9A can be N+ type. Accordingly, it is possible to control the electric potential of the bottom portion diffused layer 13 by using the electric potential of the lower portion diffused layer contact 12b which is formed at an upper portion of the lower portion diffused layer leading portion 9A.

Figure 6A:
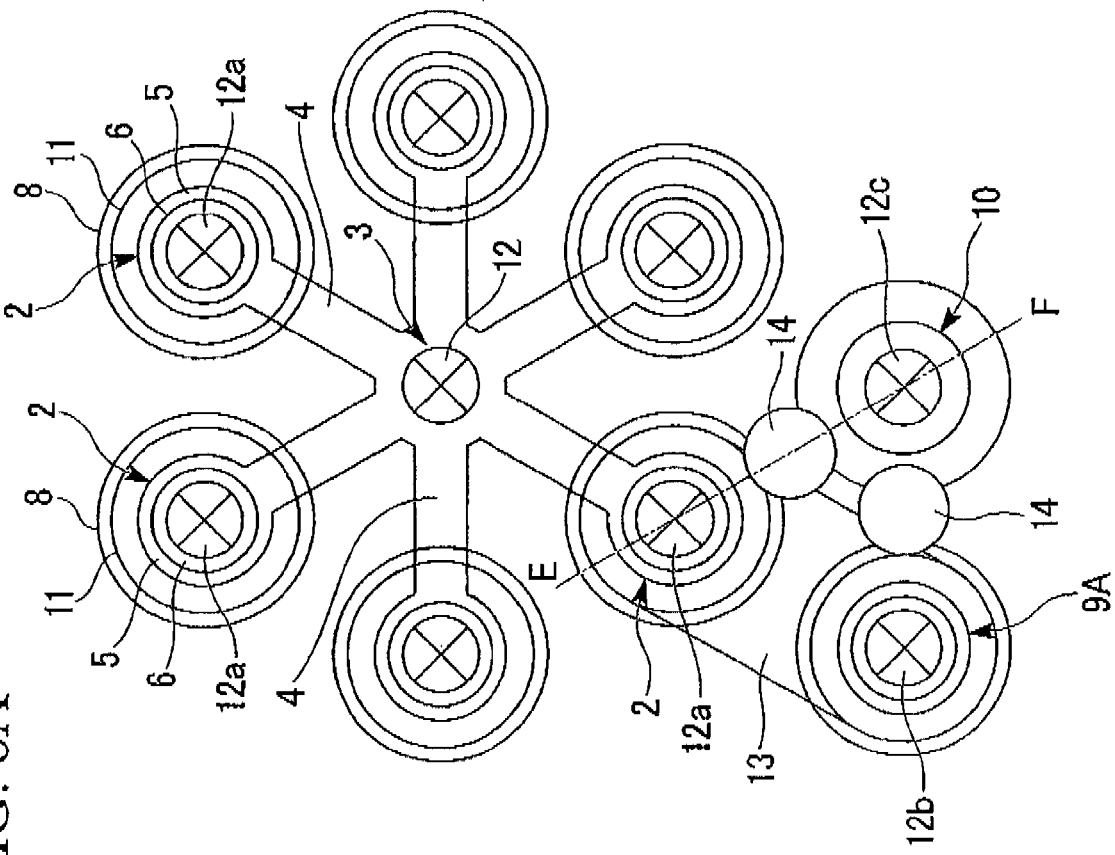
FIG. 6A is a plane view of a three-dimensional transistor of the embodiment.
Figure 6B:
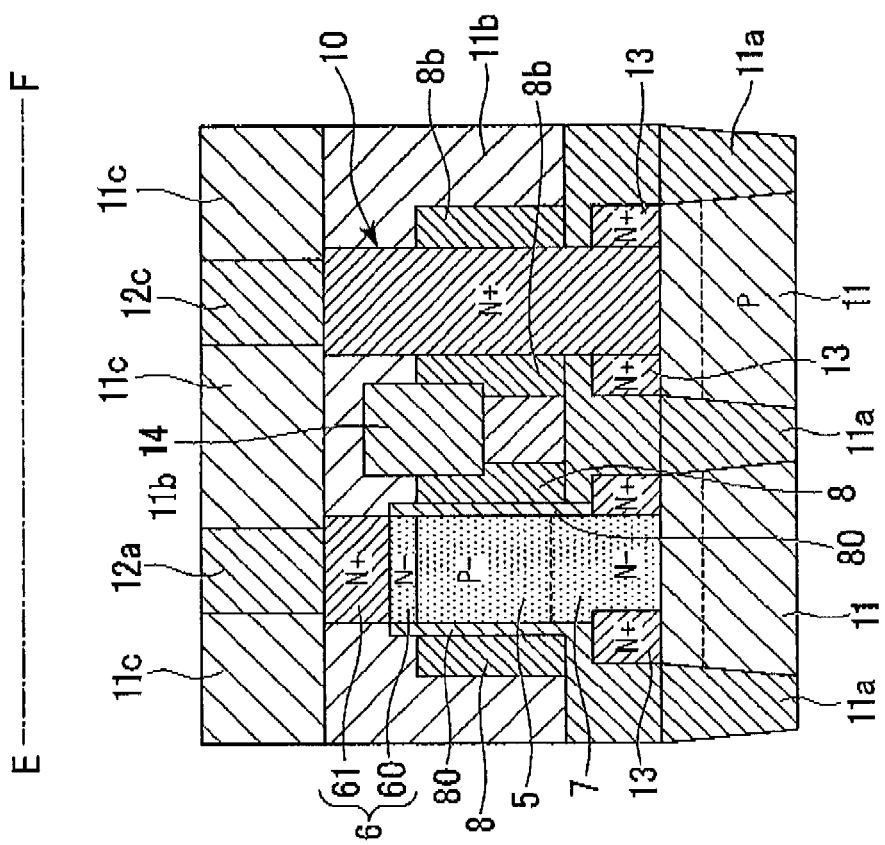
FIG. 6B shows a cross-section of a three-dimensional transistor of the embodiment taken along a line E-P of FIG. 6A.

As shown in FIG. 6B, a center portion of the gate electrode leading portion 10 is surrounded by the gate electrode 8b. The gate electrode 8b is connected to the gate electrode 8 via an embedded plug 14 and is electrically connected to the first pillar 2.

The gate electrode leading portion 10 does not provide a gate insulation film, and the gate electrode 8b is directly connected to the gate electrode leading portion 10. Therefore, the gate electrode leading portion 10 is formed as "N+" as a whole. In accordance with such a constitution, it is possible to control the electric potential of the gate electrode 8 by using the electric potential of the gate contact 12c.

Figure 7A:
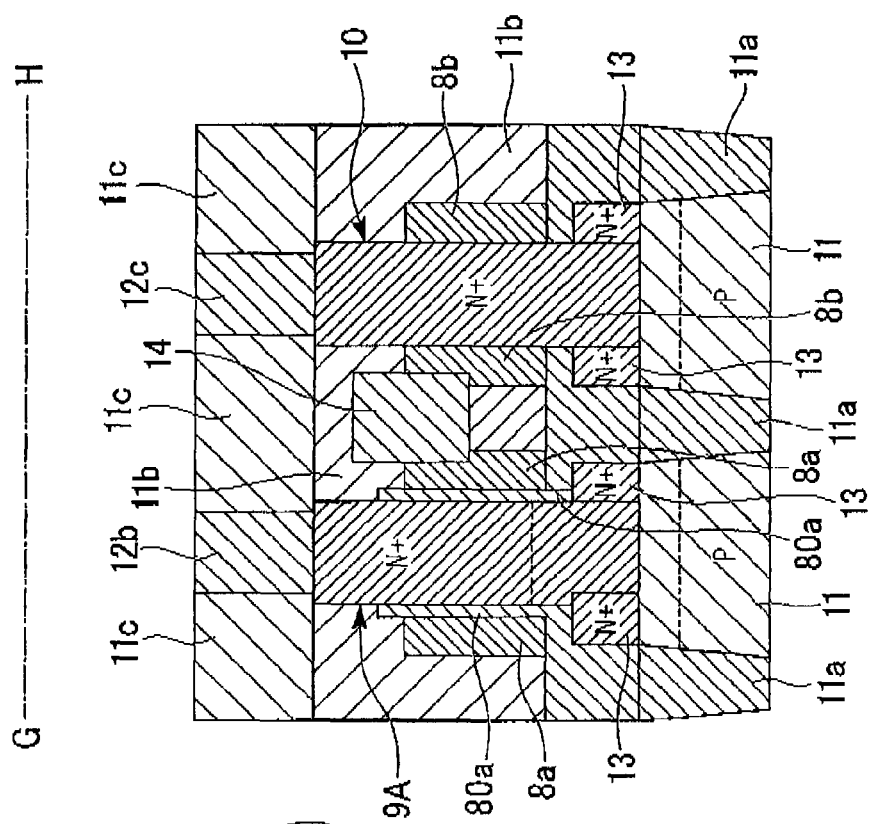
FIG. 7A is a plane view of a three-dimensional transistor of the embodiment.
Figure 7B:
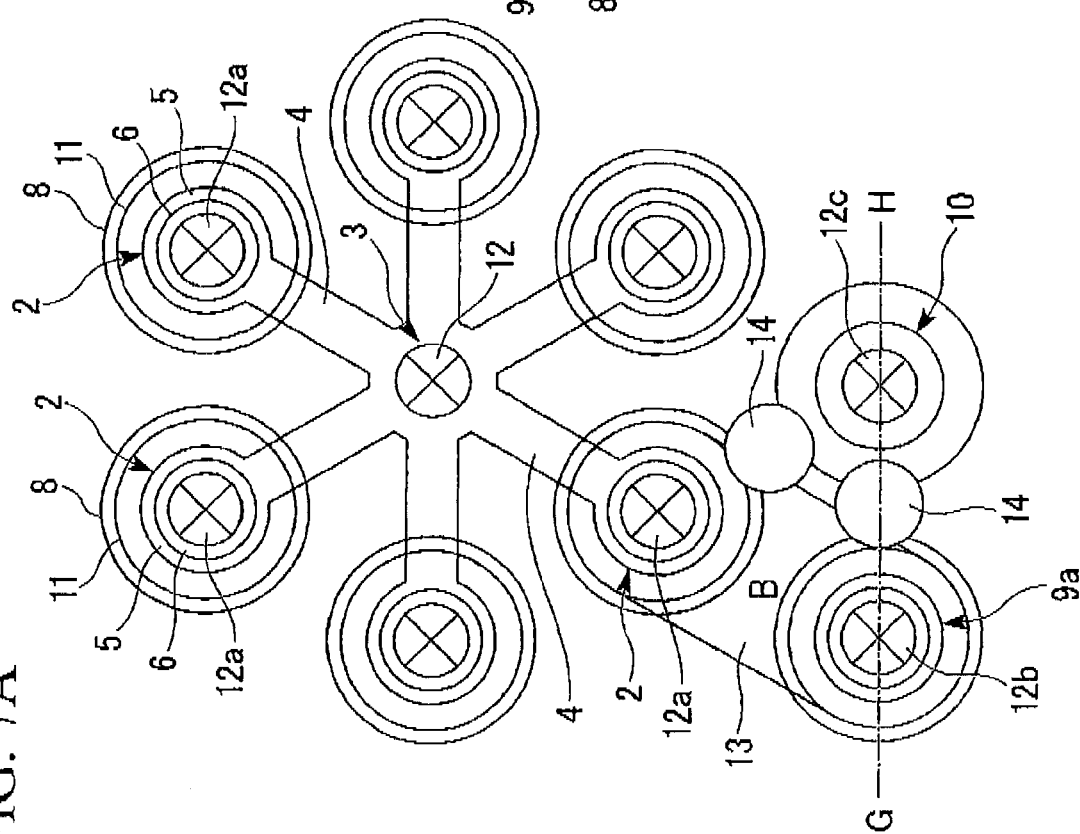
FIG. 7B shows a cross-section of a three-dimensional transistor of the embodiment taken along a line G-H of FIG. 7A.

In addition, as shown in FIGS. 7A and 7B, the gate electrodes 8b and 8a are connected via another embedded plug 14, and the gate electrode leading portion 10 is electrically connected to the lower portion diffused layer leading portion 9A. In accordance with such a constitution, it is possible to control the electric potential of the gate electrode 8 of the lower portion diffused layer leading portion 9A by using the electric potential of the gate contact 12c.

Figure 8:
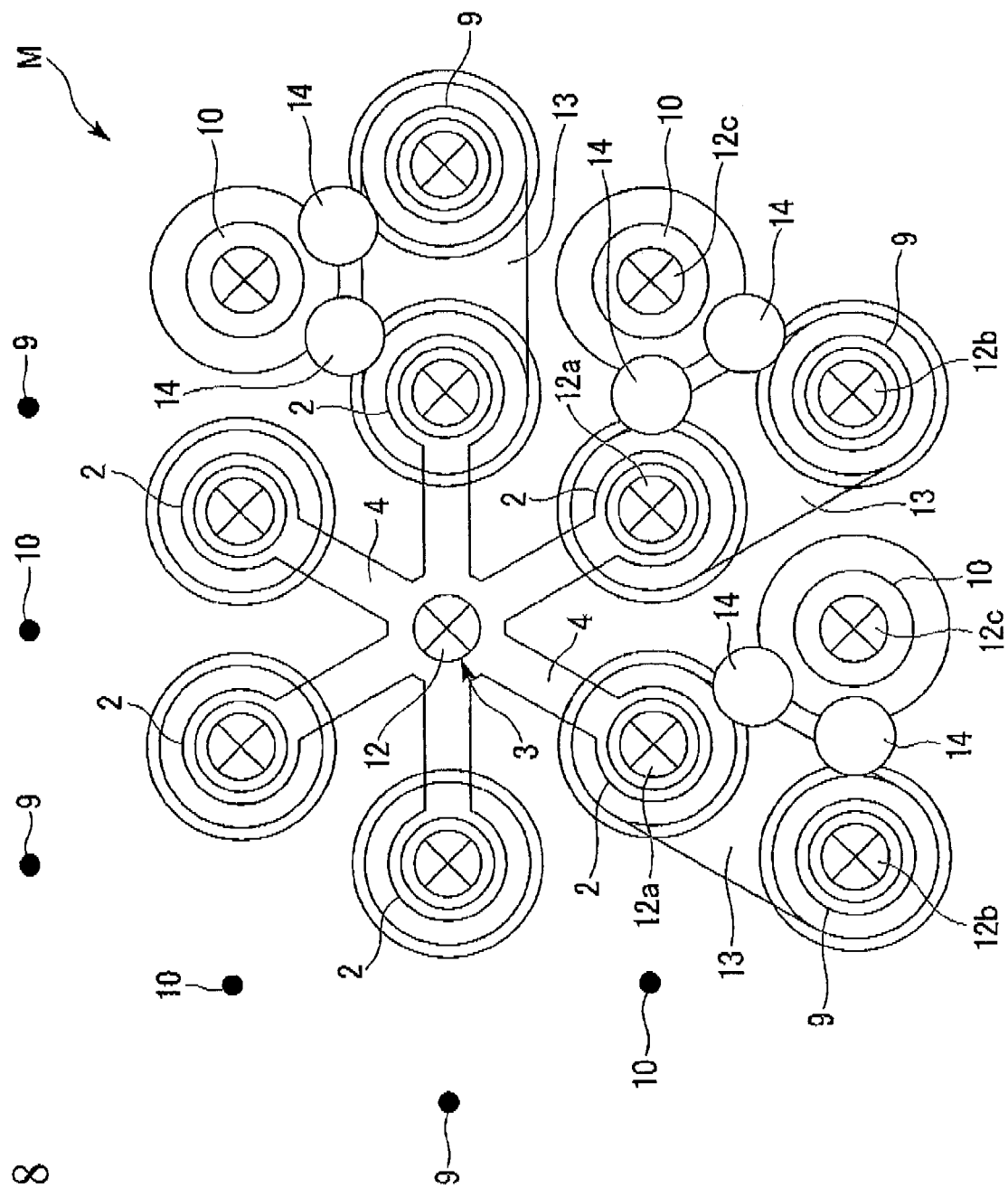
FIG. 8 is a plane view of a three-dimensional transistor of the embodiment in which six sets of transistor fundamental portions are arranged.

FIG. 8 shows an example of an arrangement of six sets of transistor fundamental portions explained above.

The second pillar 3, that is, the well contact 12 which can fix or set the electric potential of the P type well area 11 is set at the center, and six sets of the first pillars 2 which constitute the three-dimensional transistor are arranged around the second pillar 3. In addition, the outside six sets of the first pillars 2, both six sets of the lower portion diffused layer leading portions 9 and six sets of the gate electrode leading portions 10 are arranged. (In FIG. 8, some of both the lower portion diffused layer leading portions 9 and the gate electrode leading portions 10 are abbreviated.)

Accordingly, it is possible to achieve a closest packed structure, and it is possible to produce a further highly integrated semiconductor apparatus. Such an arrangement constitutes one module M.

Figures 9A, 9B:
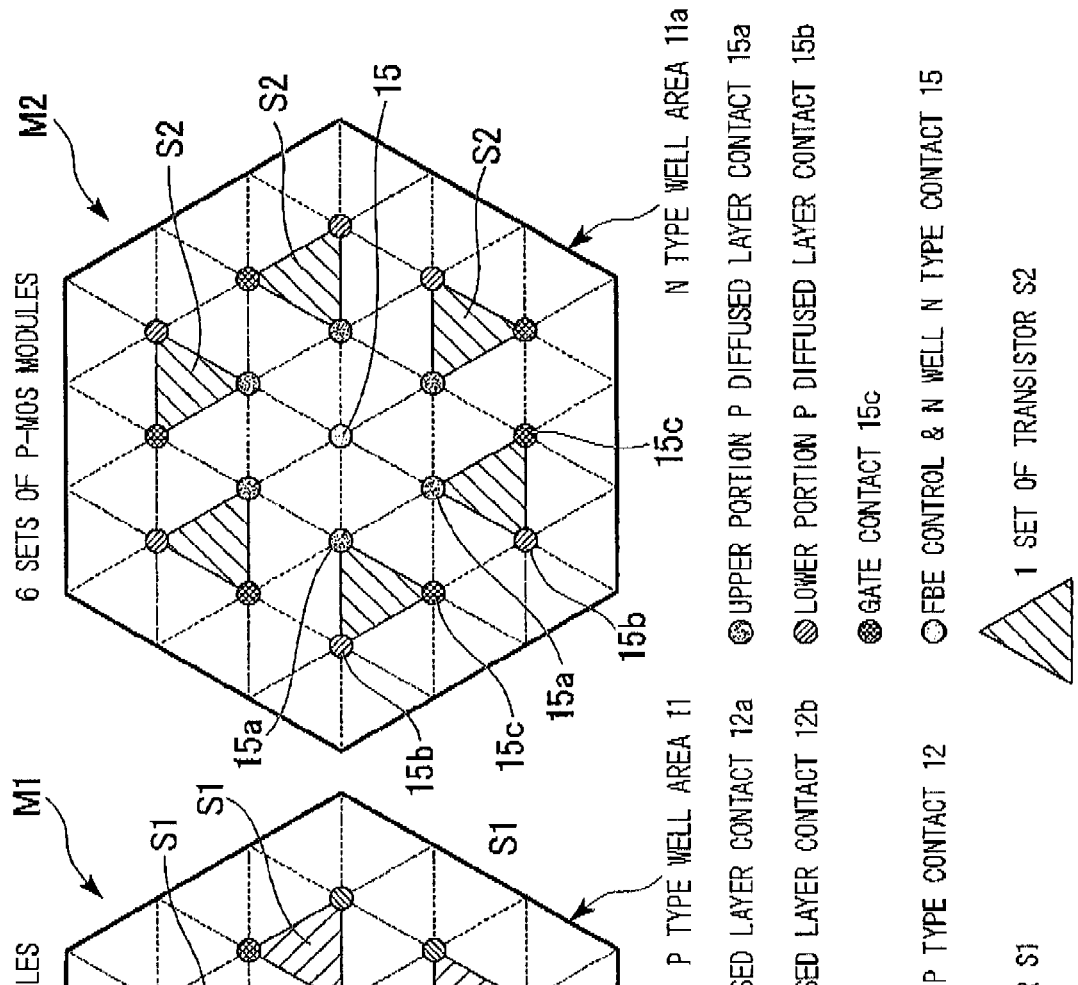
FIG. 9A is a schematic drawing of 6 sets of N-MOS modules constituted from three-dimensional transistors of the embodiment.
FIG. 9B is a schematic drawing of 6 sets of P-MOS modules constituted from three-dimensional transistors of the embodiment.

FIGS. 9A and 9B show a brief outline of a constitution of an arrangement of the module M. FIG. 9A shows the module M of six sets of N-MOS which is the same as the module M shown in FIG. 8. FIG. 9B shows a module M2 of six sets of P-MOS. The module M of six sets of N-MOS is formed on the P type well area 11 which is a hexagon.

A constitution of the N-MOS is explained in the above description, and in order to apply this embodiment to the P-MOS, it is possible to obtain cross-sections of each of the transistors of the P-MOS by changing "N" of FIGS. 1-8 to "P". In addition, contacts of the first pillar 2, the second pillar 3, the lower portion diffused layer leading portion 9 and the gate electrode leading portion 10 (upper portion diffused layer contact 12a, well contact 12, lower portion diffused layer contact 12b and gate contact 12c) are replaced by an upper portion diffused layer contact 15a, a well contact 15, a lower portion diffused layer contact 15b and a gate contact 15c that are for the P-MOS.

The module M2 of six sets of P-MOS is formed on the N type well area 11a which is a hexagon.

Figure 10:
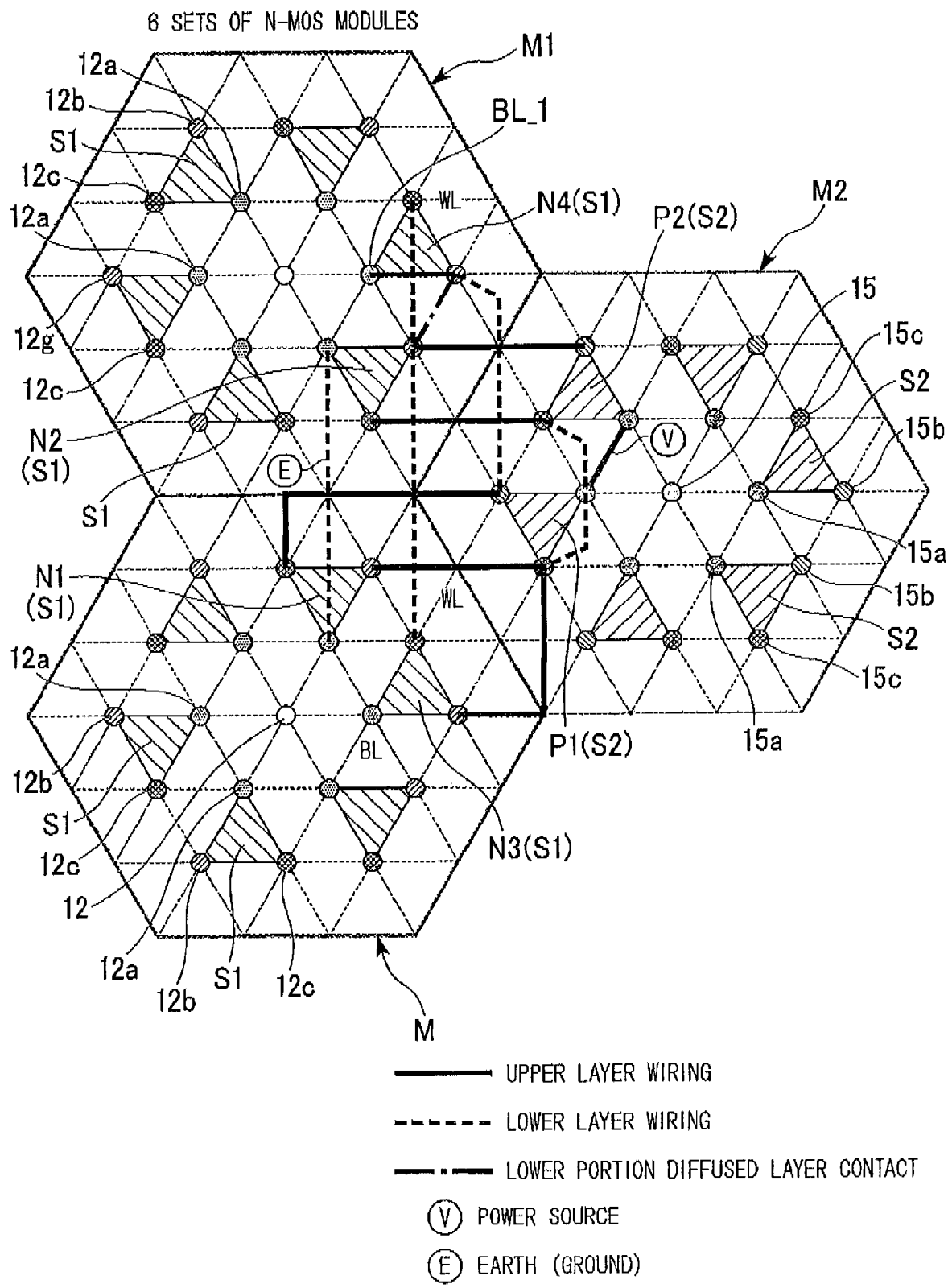
FIG. 10 is a schematic drawing of SRAM constituted from modules shown in FIGS. 9A and 9B.

By combining the modules M1/M2 shown in FIG. 9A/9B, for example, as shown in FIG. 10, by arranging both 2 sets of the modules M1 of 6 N-MOS and 1 set of the module M2 of 6 P-MOS, it is possible to constitute an SRAM (Static Random Access Memory).

Here an SRAM memory cells are constituted from 4 sets of N-MOS (N1, N2, N3 and N4) and 2 sets of P-MOS (P1 and P2). These memory cells are connected by using upper layer wirings, lower layer wirings and a lower portion diffused layer connection.

It should be noted that the lower portion diffused layer connection can be obtained because the first insulation layer 11a is not formed between the lower portion diffused layers 7a of N4 and N2. Therefore, the lower portion diffused layers 7a of N4 and N2 share the same N type diffused layer. This is a state in which lower portions of a pair of pins are connected to each other, for example, in a case of supplying the electric potential of the lower diffused layer from an upper portion of a pin.

In FIG. 10, WL is a word line, BL and BL_1 are bit lines, V I a power source and E is an earth (ground).

Figure 11:
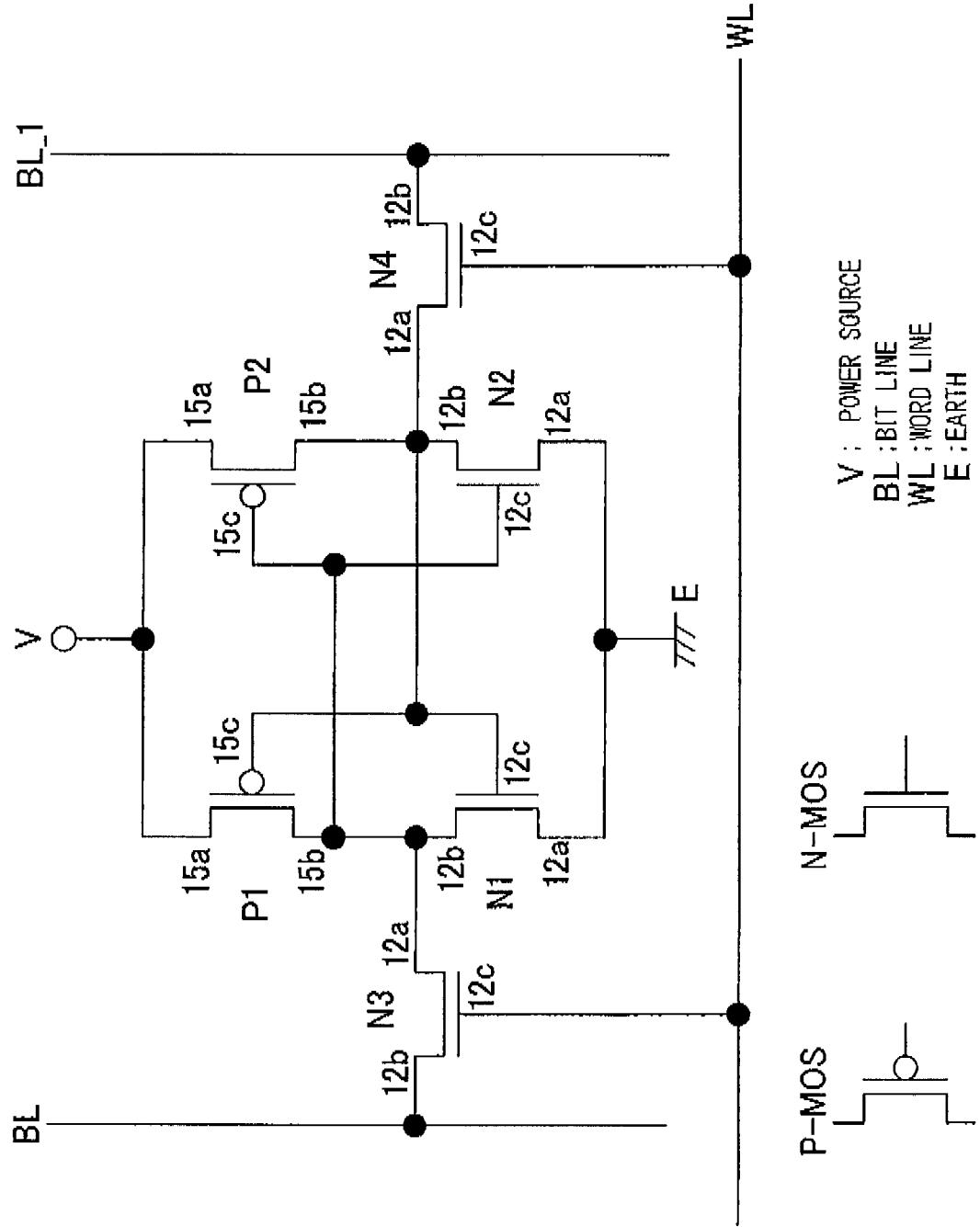
FIG. 11 is a circuit diagram of a SRAM cell shown in FIG. 10.

FIG. 11 shows a circuit diagram of a memory cell shown in FIG. 10. Memory cells N1 and N2 are connected to each other at the upper portion diffused layers 12a while being connected to earth ground E, and memory cells P1 and P2 are connected to each other at the upper portion diffused layer contacts 15a while being connected to the power source V.

In addition, the memory cells N1 and P1 are connected between the lower portion diffused layer contacts 12b and 15b and between the gate contacts 12c and 15c, and so are the memory cells N2 and P2.

Three points are connected which include: a point on a connected line between the lower portion diffused layer contacts 12b and 15b of the memory cells N1 and P1; a point on a connected line between the gate contacts 12c and 15c of the memory cells N2 and P2; and the upper portion contact 12a of the memory cell N3.

Three points are connected which include: a point on a connected line between the lower portion diffused layer contacts 12c and 15c of the memory cells N1 and P1; a point on a connected line between the gate contacts 12b and 15b of the memory cells N2 and P2; and the upper portion contact 12a of the memory cell N4.

The gate contacts 12c of both the memory cells N3 and N4 are connected to the word line WL, the lower portion diffused layer contact 12b of the memory cell N3 is connected to the bit line BL, and the lower portion diffused layer contact 12b of the memory cell N4 is connected to the bit line BL_1.

In accordance with such a constitution, a circuit of a memory cell of SRAM is constituted.

As explained above, the semiconductor apparatus (MOS transistor 1) of this embodiment includes multiple thee-dimensional transistors which are arranged on the well area 11 so as to surround the electrically-conductive second pillar 3 and which each have: the first pillars; the channel portion 5 provided at the first pillar 2; the upper portion diffused layer 6 formed at an upper portion of the channel portion 5; the lower portion diffused layer 7 formed at a lower portion of the channel portion 5; and the gate electrode 8 provided around the channel portion 5 via a gate insulation film 8a. In addition, the multiple three dimensional transistors share the second pillar 3 which is a single pillar, and the channel portions 5 of the multiple three dimensional transistors are each connected to the second pillar 3 by the channel connection portion 4. Therefore, the electric potential of the channel portion 5 is fixed by the second pillar 3, and it is possible to obtain an advantage of reducing the floating body effect.

In addition, regarding the MOS transistor 1 of this embodiment, the six three-dimensional transistors share the second pillar 3 which is a single pillar and are connected to the second pillar 3 while surrounding the second pillar 3. Therefore, the three-dimensional transistors ate arranged in a closest packed structure, and it is possible to obtain a semiconductor apparatus that is highly integrated.

In addition, in the MOS transistor 1 of this embodiment, each of the three-dimension transistors has both the lower diffused layer leading portion 9 and the gate electrode leading portion 10 that are close to the first pillar 2. The three-dimensional transistors surrounded by the P type well layer 11 constitute a module in a manner in which each of the three-dimensional transistors is arranged at a vertex of a hexagon that has a center at which the second pillar 3 is set. Therefore, by using the module M1 as a unit, it is possible to constitute a transistor from multiple units, and it is possible to produce a semiconductor apparatus which is large and has a complicated structure.

In addition, in the MOS transistor 1 of this embodiment, the modules M1 are arranged in a honeycomb state. Therefore, it is possible to obtain the MOS transistor 1 that has a closest packed structure, it is possible to achieve a fine layout, and it is possible to produce a further highly integrated semiconductor apparatus.

Figure 12:
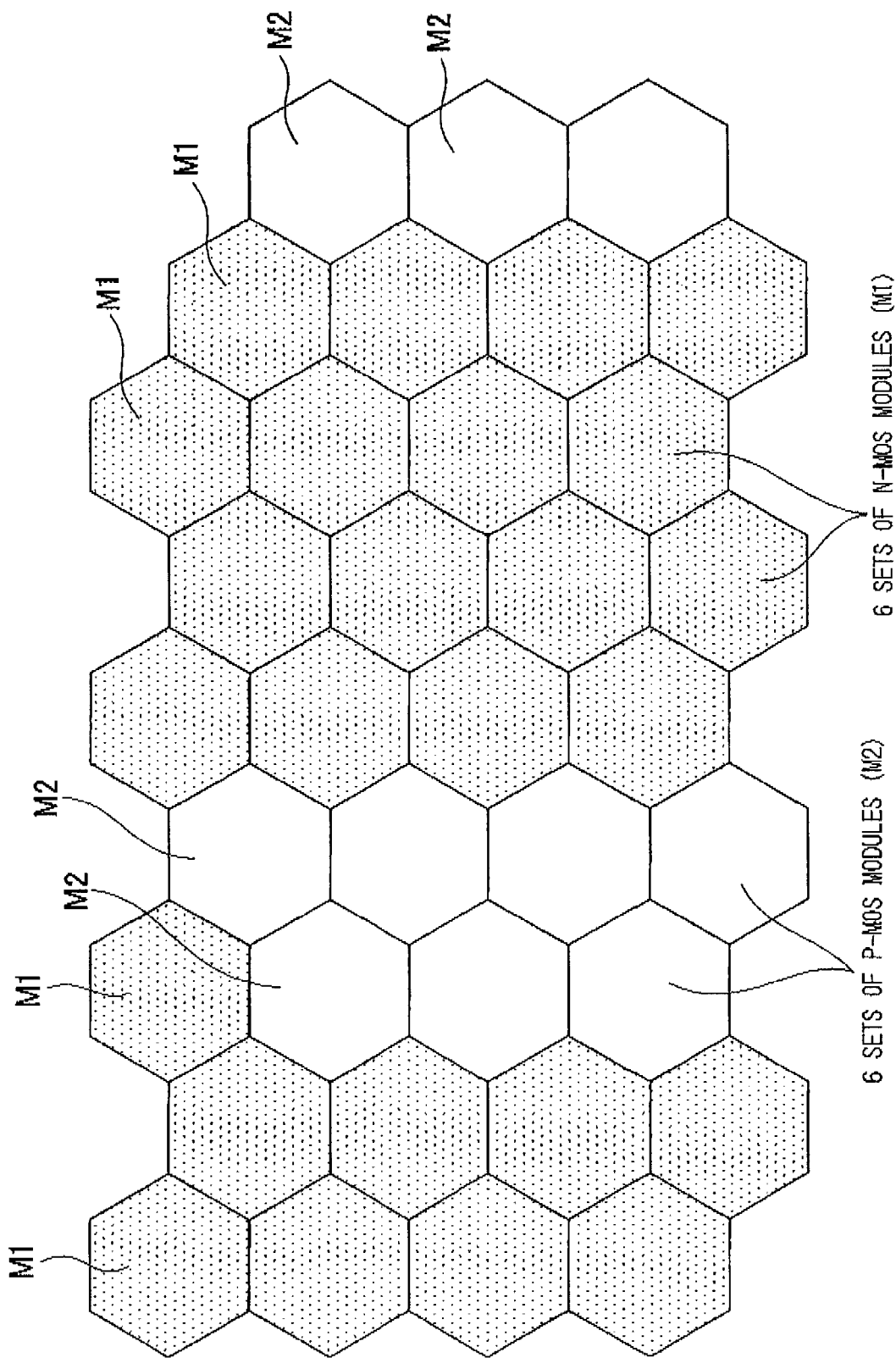
FIG. 12 is a schematic drawing of multiple SRAM cells constituted from modules shown in FIGS. 9A and 9B.
Figure 13:
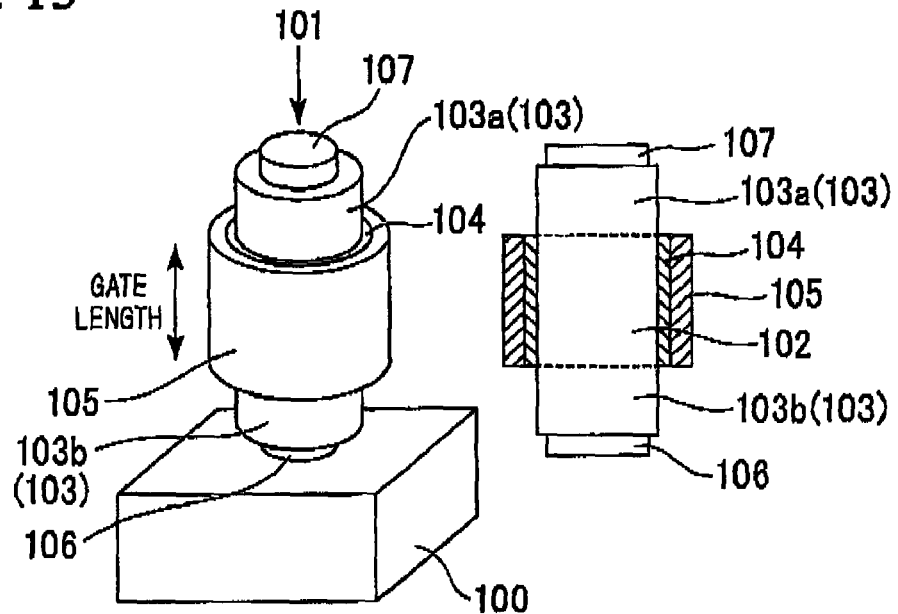
FIG. 13 shows a perspective view of a three-dimensional transistor of SGT in a conventional example.
Figure 14:
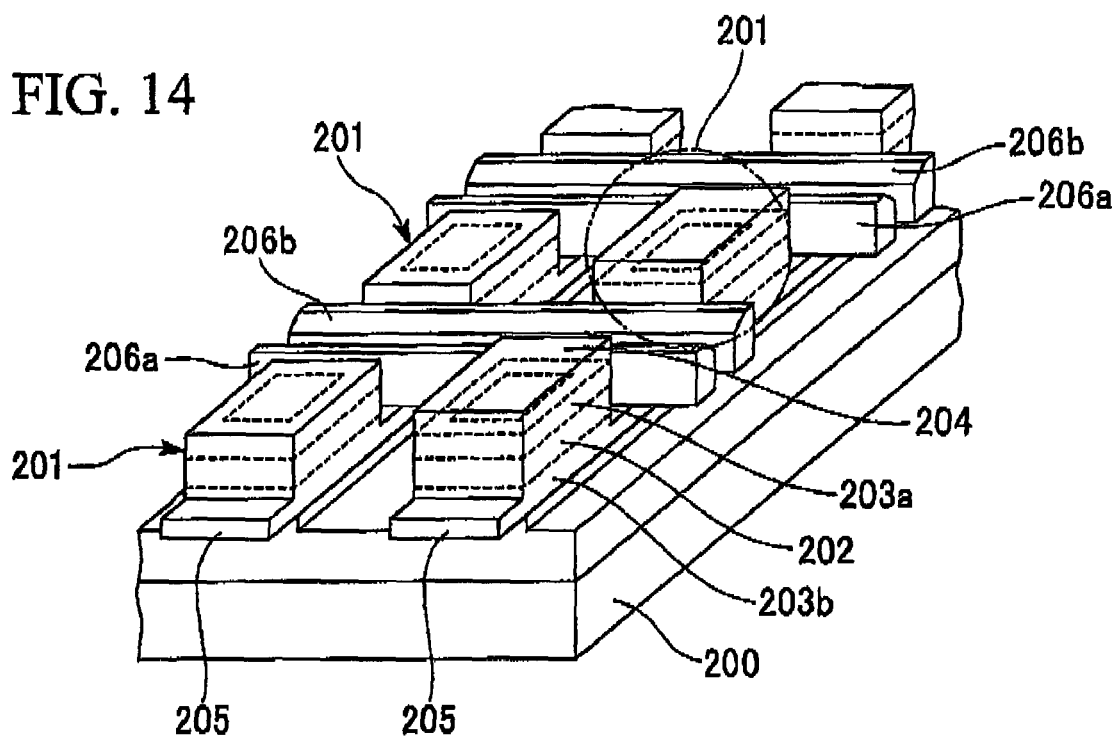
FIG. 14 shows a perspective view of a memory cell constituted from a three-dimensional transistor of a conventional example.

In addition, when multiple sets of the SRAM cells are arranged, as shown in FIG. 12, the modules M1 and M2 are arranged which are constituted from 6 sets of the MOS. Therefore, it is possible to achieve the closest packed structure by arranging in a honeycomb state, it is possible to achieve a fine layout, and it is possible to produce a further highly integrated semiconductor apparatus.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor apparatus comprising:
   a plurality of three-dimensional transistors each of which comprises:
      a first pillar;
      a channel portion provided at the first pillar;
      diffused layers formed at both an upper portion and a lower portion of the channel portion; and
      a gate electrode provided around the channel portion via a gate insulation film; and
   a second pillar which is electrically conductive, wherein
   the plurality of three-dimensional transistors are arranged on a well area while surrounding the second pillar,
   the plurality of three dimensional transistors share the second pillar, and
   the channel portions of the plurality of three dimensional transistors are each connected to the second pillar by a channel connection portion.

2. A semiconductor apparatus according to claim 1, wherein six three-dimensional transistors are provided and share the second pillar which is a single pillar, and the six three-dimensional transistors are connected to the second pillar while surrounding the second pillar.

3. A semiconductor apparatus according to claim 2, wherein
   each of the three-dimensional transistors comprises both a lower diffused layer leading portion and a gate electrode leading portion that are close to the first pillar, and
   the three-dimensional transistors surrounded by the well layer constitute a module in which each of the three-dimensional transistors is arranged at a vertex of a hexagon that has a center at which the second pillar is set.

4. A semiconductor apparatus according to claim 3, wherein the module is arranged in a honeycomb state.

5. A semiconductor apparatus production method comprising steps of:
   forming a channel portion provided at each of multiple first pillars;
   forming diffused layers at an upper portion and a lower portion of the channel portion; forming each of multiple three-dimensional transistors by forming a gate terminal around the channel portion via a gate insulation film; and
   arranging the plurality of three-dimensional transistors on a well area while surrounding a second pillar which is electrically conductive, wherein
   the multiple three-dimensional transistors share the second pillar which is a single pillar, and
   the channel portions of the multiple three dimensional transistors are respectively connected to the second pillar by a channel connection portion.

6. A semiconductor apparatus production method according to claim 5, wherein six sets of the three-dimensional transistors share the second pillar and are connected to the second pillar while surrounding the second pillar.

7. A semiconductor apparatus production method according to claim 6, wherein
   each of the three-dimensional transistors comprises both a lower diffused layer leading portion and a gate electrode leading portion that are formed to be close to the first pillar, and
   each of the three-dimensional transistors is arranged as a module surrounded by the well layer and is arranged at a vertex of a hexagon that has a center at which the second pillar is set.

8. A semiconductor apparatus production method according to claim 7, wherein the module is arranged in a honeycomb state.

9. A semiconductor apparatus comprising a transistor which comprises:
   a first pillar formed in a vertical direction on a substrate;
   a first diffused layer formed on the first pillar;
   a second diffused layer formed on the first pillar;
   a channel portion provided between the first and second diffused layers;
   a gate insulation film covering a surface of the channel portion; and
   a second pillar formed in a vertical direction on the substrate, wherein
   the channel portion of the first pillar is electrically connected to the second pillar.

10. A semiconductor apparatus according to claim 9, wherein
   the first pillar is plural,
   the plurality of first pins are arranged around the second pillar, and
   each of the channel portions of the plurality of first pillars is electrically connected to the second pillar.

11. A semiconductor apparatus according to claim 10, wherein the first pillar and the plurality of second pillars constitute one set of pins, and the semiconductor apparatus comprises a plurality of sets of pins.

* * * * *